United States Patent [19]

Adam et al.

[11] Patent Number: 4,785,269
[45] Date of Patent: Nov. 15, 1988

[54] MAGNETICALLY TUNED HIGH OVERTONE BULK ACOUSTIC RESONATOR

[75] Inventors: John D. Adam, Murrysville; Bruce R. McAvoy, Pittsburgh, both of Pa.

[73] Assignee: Westinghouse Electric Corp., Pittsburgh, Pa.

[21] Appl. No.: 863,481

[22] Filed: May 15, 1986

[51] Int. Cl.⁴ .............................................. H03H 9/00
[52] U.S. Cl. .................................. 333/188; 333/191; 310/321; 310/348
[58] Field of Search .......................... 333/186–192, 333/148, 141, 219; 310/311, 320, 321, 322, 334, 348, 349, 357

[56] References Cited

U.S. PATENT DOCUMENTS

| | | | |
|---|---|---|---|
| 3,405,029 | 10/1968 | Hanes et al. | 333/141 X |
| 3,461,408 | 8/1969 | Onoe et al. | 333/187 |
| 3,514,724 | 5/1970 | Bennett et al. | 333/24 R X |
| 3,517,349 | 6/1970 | Engeler et al. | 333/186 |
| 3,543,058 | 11/1970 | Klemens | 310/322 |
| 3,621,309 | 11/1971 | Yokoyama et al. | 310/321 |
| 3,678,304 | 7/1972 | Humphryes et al. | 310/322 X |
| 3,753,165 | 8/1973 | Morgenthaler | 333/186 |
| 3,800,908 | 4/1974 | Wauk | 333/141 X |
| 4,016,512 | 4/1977 | Wauk | 310/334 X |
| 4,016,515 | 4/1977 | Wauk | 310/334 X |
| 4,573,027 | 2/1986 | Buchalter et al. | 333/17 R |

OTHER PUBLICATIONS

Carter, "Magnetically-Tunable . . . Resonators", IRE Transactions on MTT, May 1961, pp. 252–260.
Krishnaswamy et al, "Temperature Compensated . . . Resonators in LiTaO₃", Applied Physics Letters, 15 Aug. 1984, pp. 368–369.

Primary Examiner—Eugene R. LaRoche
Assistant Examiner—Seung Ham
Attorney, Agent, or Firm—W. G. Sutcliff

[57] ABSTRACT

Electroacoustic resonating apparatus capable of generating resonances of tunable frequencies. The apparatus includes two transducers coupled to a ferrimagnetic substrate at opposite ends thereof. The first transducer converts an input signal into a signal that produces bulk acoustic waves in the ferrimagnetic substrate. The second transducer receives the bulk acoustic waves and converts them into electrical signals, or alternatively a single transducer which performs both input and output functions. Variable magnetizing means located proximate to the ferrimagnetic substrate induces a magnetic field throughout the substrate wherein the magnetic field alters the frequencies of the resonance of the acoustic waves. By varying the magnitude of the magnetic field, the frequencies of the resonances may be varied, thereby allowing tuning of the apparatus.

3 Claims, 2 Drawing Sheets

MAGNETICALLY TUNED HIGH OVERTONE BULK ACOUSTIC RESONATOR

BACKGROUND OF THE INVENTION

1. Field of the Invention

This invention relates generally to electroacoustic resonating apparatus and more specifically to apparatus for generating resonances of tunable frequencies.

2. Description of the Prior Art

Stable, low noise oscillators are a vital element in radar systems for their ability to provide coherent synchronization between the radar's transmitted signals and received signals. To provide this function, the oscillator frequency must be highly stable, with low noise spectral power density.

In a typical system, the output of a low noise quartz oscillator at 80 MHz is multiplied in frequency to the desired radar carrier frequency. The phase noise at greater than 10 KHz from the carrier frequency can be further reduced by use of a very high Q resonator, such as an HBAR (high overtone bulk acoustic resonator) which have shown Q's of greater than 50,000 at 1.5 G.Hz.

Typically, the low frequency (80 MHz) quartz oscillator is designed for lowest phase noise and not necessarily low frequency drift. Thus, the frequency drift of the low frequency oscillator output may exceed the bandwidth of the HBAR filter and the noise filtering will not be effective. It is desirable that the frequency of the HBAR filter can "track" the frequency drift of the low frequency oscillator so that the radar carrier frequency is always in the center of the HBAR passband.

This tracking is achieved by use of a tunable HBAR, connected into an automatic frequency control loop. Use of a tracking filter also allows any manufacturing tolerances to be automatically tuned out.

In the prior art, the sole means of controlling the resonance frequencies of the high overtone bulk acoustic resonator is to vary the temperature of the resonator environment. A correlation between temperature and the resonance frequencies of an acoustic resonator was described in an article entitled "Temperature Compensated Bulk Sheer Microwave Resonators in LiTaO$_3$" in *Applied Physics Letters* Aug. 15, 1984 by B. R. McAvoy, co-inventor of the present application and S. V. Krishnaswamy. The teachings of this article are hereby incorporated by reference into the present application. This correlation allows tuning of the resonator by means of increasing or decreasing the temperature of the resonator environment. However, tuning by this means typically requires several seconds, a time period too long for use of temperature controlled high overtone bulk acoustic resonators in radar system applications.

U.S. Pat. No. 4,573,027 dated Feb. 25, 1986, entitled "Bulk Acoustic Resonator Tracking Filter," inventors Michael S. Buchalter, Francis W. Hopwood and James T. Haynes teaches an acoustic resonator not operable to be turned magnetically.

For the high overtone bulk acoustic resonator described hereinabove, a typical frequency response is shown in FIG. 1. The resonance frequencies, $f_n$, are defined by the equation $$"f_n" = \frac{(n+1)c}{2a}$$

where "c" is the velocity of the wave through the substrate, "a" is the length of the substrate and "n" is an integer typically of the order of 10$^2$. For each value n there will be a resonance associated therewith. The resonances repeat periodically with a period of "c/2a".

Changes in temperature of the high overtone bulk acoustic resonator cause the resonance frequencies of the acoustic resonator to drift to higher or lower frequencies. Experimental results indicate a parabolic dependence between the temperature and the resonance frequencies.

Shown in FIG. 2 is the relationship between the frequency of an acoustic wave and the wave number "k" defined by $$k = (2\pi/\lambda)$$

where "$\lambda$" is the wave length of the acoustic wave. The relation between "k" and "f" is linear and may be described by the expression $f = ck$; where "f" is the frequency of the acoustic wave, "k" is the wave number, and "c" is the velocity of the wave through the medium.

When acoustic waves are caused to propagate through a ferrimagnetic material, the relationship between the frequency f, and the wave number "k" is no longer purely linear due to a magneto-elastic interaction with spin waves. The spin waves are caused by exchange coupling between successive ferrimagnetic atoms, and are defined by the equation:

$$(f/\gamma) = H + Dk^2$$

where "f" is the frequency of the spin wave, "$\gamma$" is a gyromagnetic ratio (2.8 MHz/Oe), "H" is the magnitude of the magnetic field intensity in the ferrimagnetic material (Oe), "D" is an exchange constant and k is the wave number (cm$^{-1}$). Such a relationship is shown in FIG. 3. By altering the magnitude of the magnetic field intensity "H", the spin wave may be translated up or down in frequency.

In FIG. 4 the curves representing the acoustic wave and the spin wave are plotted simultaneously. The two curves cross over, the particular frequency of which is determined by the magnitude of the magnetic field intensity "H". At this point where the wave lengths and frequencies of the two waves are equal, coupling between the waves occurs. The resultant relation called the dispersion relation, is expressed graphically in FIG. 5.

At lower wave numbers, k, the frequency of the wave is in the acoustic region 10 of the curve wherein the relationship between f and H is linear. At high wave numbers, k, the frequency of the wave is in the magnetic region 12 wherein the relationship between f and k is quadratic. Most importantly, for certain values of wave numbers k, the frequency of the wave is in a third region which is neither purely acoustic nor purely magnetic. This third region, the magneto-elastic region 14, exhibits characteristics of both the acoustic region 10 and the magnetic region 12. For a given wave number in the magneto-acoustic region 14, then, the associated resonance frequency is different than for the pure acoustic wave of FIG. 2 or for the pure magnetic spin wave of FIG. 3. By altering the magnitude of the magnetic field intensity, the location of this magneto-elastic region 14 may be altered. This effectively allows fine tuning of the frequency location of a resonance for a given wave number k.

SUMMARY OF THE INVENTION

In accordance with the present invention, a tunable device for generating signals of variable frequency resonances includes an input transducer coupled to one surface of a ferrimagnetic substrate. The input transducer converts an input signal into a signal which produces bulk acoustic waves in the ferrimagnetic substrate. An output transducer is coupled to a second surface of the ferrimagnetic substrate to receive the bulk acoustic waves and to produce electrical signals in response to the bulk acoustic waves. Variable magnetizing means is located proximate to the ferrimagnetic substrate for generating a magnetic field in the ferrimagnetic substrate. By altering the magnitude of the magnetic field in the ferrimagnetic substrate the frequencies of resonance of the acoustic resonator may be altered.

BRIEF DESCRIPTION OF THE DRAWINGS

The invention may be better understood and further advantages and uses thereof more readily apparent when considered in view of the following detailed description of exemplary embodiments taken with the accompanying drawings in which.

DESCRIPTION OF THE PREFERRED EMBODIMENT

Figure 6A:
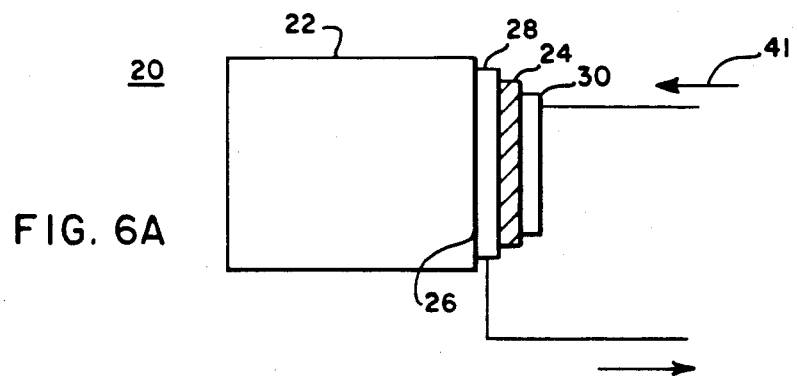
FIG. 6A is a schematic of a high overtone bulk acoustic resonator.

Turning now to FIG. 6A there is shown a high overtone bulk acoustic resonating device 20. A substrate 22 is composed of a ferrimagnetic material suitable for propagating bulk acoustic waves. Substrate material or the preferred embodiment is a crystal of yttrium iron garnet (YIG) but other materials may be used, such as a doped YIG, ferrites and FeBO$_3$, for example.

A single transducer 24 is mounted on an upper surface 26 of the substrate 22 for generating bulk acoustic waves toward the lower surface 27 of substrate 22. The piezoelectric transducer 24 may be comprised of a substance suitable for fabrication through the use of vapor deposition techniques. For example, in fabricating the transducer, an electrode 28 is deposited on the substrate 22 and the piezoelectric transducer material 24 such as zinc oxide may be deposited over electrode 28. A second electrode 30 is deposited over the piezoelectric transducer material 24 and over electrode 28 in the area where transducer action is desired. The electrode area of the transducer corresponds to the aperture from which ultrasonic waves propagate into the substrate 22.

This is the simplest form of an HBAR, having a transducer 24, on only one face 26, of the single crystaL plate 22. At the HBAR resonance frequencies the input impedance of the transducer behaves like a tuned circuit with a very high Q. The HBAR can be used to stabilize an oscillator or as a tracking filter to improve the noise performance of an oscillator. This configuration is more difficult to use than the preferred arrangement where transducers are deposited on both faces 27, 26 of the single crystal plate 22.

Figure 6B:
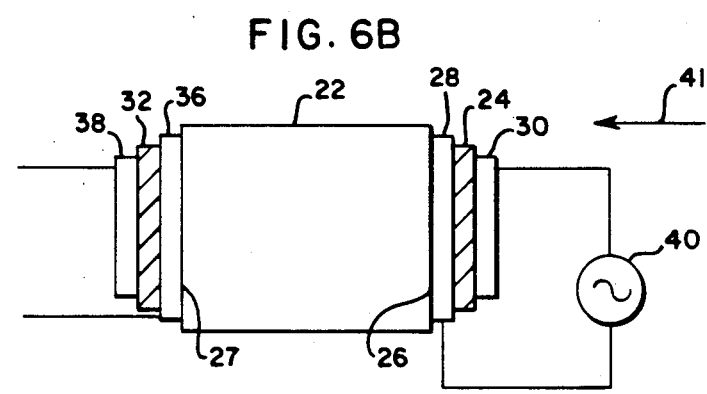
FIG. 6B is a schematic of a high overtone bulk acoustic resonator constructed according to the teachings of the present invention.

FIG. 6B is an example of a simple HBAR 20 having transducers 24, 32 applied to both faces, 26, 27 of a single crystal 22. As in FIG. 6A, a single transducer 24 is mounted on an upper surface 26 of the substrate 22 for generating bulk acoustic waves toward the lower surface 27 of substrate 22. Similarly, a second piezoelectric transducer 32 is mounted on the lower surface 27 of substrate 22 for receiving bulk acoustic waves from the upper surface 26 of substrate 22. The second piezoelectric transducer 32 may also be comprised of a substance suitable for fabrication through the use of vapor deposition techniques. In fabricating the transducer 32, an electrode 36 is deposited on the substrate 22 and the piezoelectric transducer material 32 such as zinc oxide may be deposited over electrode 36. A second electrode 38 is deposited over the piezoelectric transducer material 32 and over electrode 36 in the area where transducer action is desired.

Electrodes 28 and 30 provide a means for coupling an input signal to the first transducer 24, while electrodes 36 and 38 provide a means for coupling an output device to the second transducer 32. The input signal coupled to electrodes 28 and 30 may be supplied by a microwave oscillator 40, for example. The high overtone bulk acoustic resonator 20 may be positioned in such a manner that an externally induced magnetic field 41 may act in a direction parallel to the propagation of waves through the resonator 20. Alternatively, the high overtone bulk acoustic resonator 20 may be positioned such that the magnetic field 41 acts in a direction perpendicular to the propagation of waves through the resonator 20.

Figure 7:
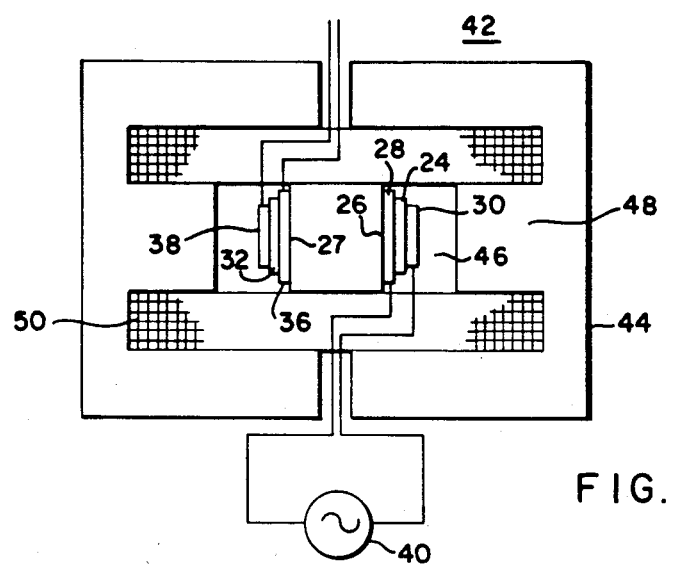
FIG. 7 is a schematic of the high overtone bulk acoustic resonator of FIG. 6 disposed in an electromagnet which produces a magnetic field in the resonator.

Shown in the cross-sectional view of FIG. 7 is one means of applying the magnetic field 41 into the resonator 20. An electromagnet means 42 which comprises two-mated C-shaped body portions 44 defining a cavity 46 and with inner core portion 48 extending within cavity 46 surrounds the resonator 20 which is disposed in the cavity 46. Wrapped around the inner core 48 and cavity 46 are electrical coils 50 which may be connected to an external voltage supply. Current in the coils 50 and the magnetic field associated therewith induces a magnetic field in the electromagnet means 42. The high overtone bulk acoustic resonator 20 may be placed in such a manner that the magnetic field produced by the electromagnetic means 42 is parallel to the direction of propagation of the acoustic waves.

Referring again to the schematic diagram of FIG. 6A, operation of the magnetically tuned high overtone bulk acoustic resonator will now be described. The magnetic field and the vector 41 representative of the magnetic field is parallel to the acoustic propagation direction.

Figure 1:
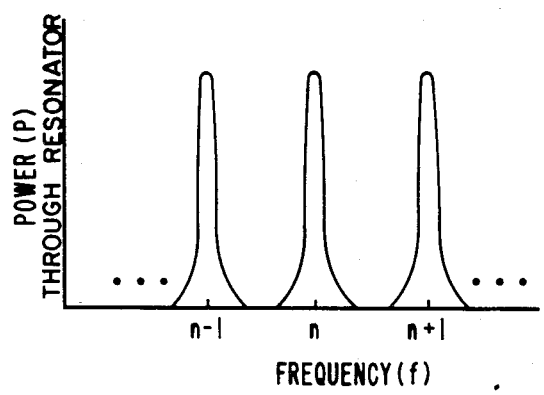
FIG. 1 is a graph which illustrates a typical pattern of resonances of the prior art produced by a high bulk overtone acoustic resonator.
Figure 2:
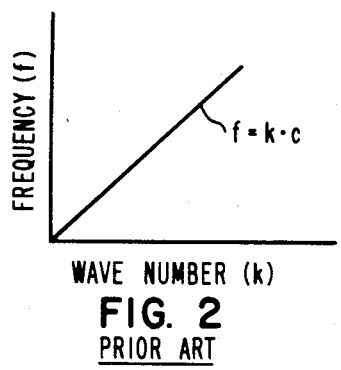
FIG. 2 is a graph which illustrates the linear relationship between the wave number and frequency for a typical acoustic wave.
Figure 3:
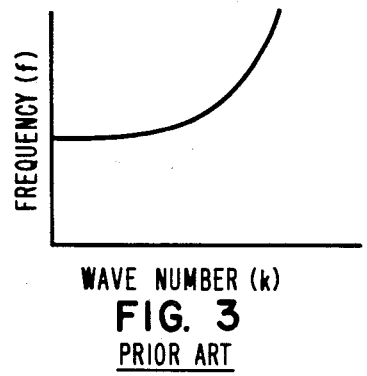
FIG. 3 is a graph which illustrates the relationship between the wave number and the frequency for a spin wave caused by exchange coupling of ferrimagnetic atoms in a lattice structure.
Figure 4:
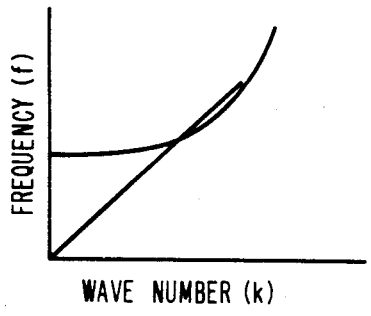
FIG. 4 is a graph which plots the acoustic wave characteristic of FIG. 2 and the spin wave characteristic of FIG. 3 on the same axis system, thereby highlighting the intersection of the two curves.
Figure 5:
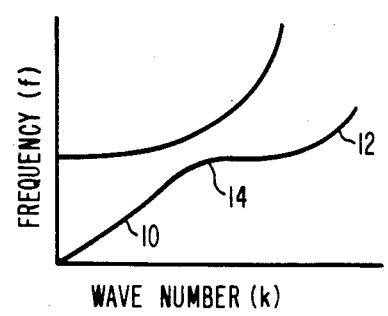
FIG. 5 is a graph which plots the dispersion relation of a ferrimagnetic material in which coupling between the acoustic wave and spin wave occurs.

When coupled to electrical connections 28 and 30, the microwave oscillator 40 generates a cyclical signal which causes the input transducer 24 to deform. The deformations of the input transducer 24 in turn creates bulk acoustic waves in the substrate 22. The bulk acoustic waves propagate through the substrate 22 until they reach the lower surface 27 of the substrate 22. The output transducer 32 is deformed by the bulk acoustic waves, and transforms the deformations into electrical signals. Electrical contacts 36 and 38 may be connected to an output device. By appropriate regulation of the magnitude of the magnetic field vector 41, certain wavenumbers of the high overtone bulk acoustic resonator are caused to be operated in the magneto-acoustic region 14 described in the Description of the Prior Art and FIG. 5 hereinabove. Spacing of the resonances of wavenumbers in the region 14 is altered. By varying the magnetic field intensity 41, the high overtone bulk acoustic resonator 20 can be caused to operate in the magneto-acoustic region 14 described with respect to FIG. 5, and the resonant frequency of the device can be varied as a function of the applied magnetic field. Through such control of the magnetic field intensity, the high overtone bulk acoustic regulator may be used to tune the frequencies of the resonances of the acoustic waves.

While the present invention has been described in connection with the preferred embodiment shown in FIG. 6A it is understood that other similar embodiments may be used or modifications and additions may be made to the described embodiment for performing the same functions of the present invention without deviating therefrom. Therefore, the present invention should not be limited to any single embodiment but rather construed in breadth and scope in accordance with the recitation of the appended claims.

We claim:

1. Tunable bulk electroacoustic apparatus for generating signals of variable frequency resonances, said tunable bulk electroacoustic apparatus generating and propagating said signals having a high Q at microwave frequencies, comprising:
    a ferrimagnetic substrate material of a thickness sufficient to produce resonant operation at a predetermined operating frequency, said ferrimagnetic substrate material propagating bulk acoustic waves, said ferrimagnetic substrate material containing an upper and lower surface;
    variable magnetizing means located proximate to said ferrimagnetic substrate material for generating a variable magnetic field in said ferrimagnetic material, said variable magnetic field produced by said variable magnetizing means acting in a direction parallel to the direction of propagation of bulk acoustic waves;
    a first input transducer means coupled to said upper surface of said ferrimagnetic substrate material for generating said bulk acoustic waves towards said lower surface, wherein said variable magnetic field varies the frequency of said bulk acoustic waves;
    a first connecting means for coupling an input signal to said first transducer;
    a second output transducer means coupled to said lower surface for receiving said bulk acoustic waves; and
    a second connecting means for coupling said second transducer to provide an output signal.

2. A tunable bulk acoustic resonating device for generating and propagating bulk acoustic waves of a variable frequency, said tunable bulk acoustic resonating device being operable to generate and propagate said bulk acoustic waves having a high Q at microwave frequencies, comprising:
    a first transducer means coupled to an oscillating means, said oscillating means operable for the generation of alternating current signals, wherein said first transducer means deforms in response to said alternating current signals;
    a ferrimagnetic substrate material suitable for propagating said bulk acoustic waves containing an upper and lower surface, said ferrimagnetic substrate material of a thickness sufficient to exhibit resonant operation at a predetermined operating frequency, said upper surface coupled to the first transducer means, wherein deformations of the first transducer means creates said bulk acoustic waves in said substrate material;
    a second transducer means coupled to said lower surface of said substrate material for receiving said bulk acoustic waves, wherein said second transducer means operable to create a voltage signal in response to said bulk acoustic waves; and
    a variable magnetizing means located proximate to said substrate material for generating a variable magnetic field in said substrate material, wherein said variable magnetic field varies the frequency of said bulk acoustic waves.

3. A tunable bulk acoustic resonating device for generating and propagating bulk acoustic waves of a variable frequency, said tunable bulk acoustic resonating device generating and propagating said bulk acoustic waves having a high Q, comprising:
    a ferrimagnetic substrate material suitable for propagating bulk acoustic waves containing an upper and a lower surface, said ferrimagnetic substrate material of a thickness sufficient to produce resonant operation at a predetermined operating frequency;
    a variable magnetizing means located proximate to said ferrimagnetic substrate material for generating a variable magnetic field in said ferrimagnetic material, said variable magnetic field produced by said variable magnetizing means acting in a direction perpendicular to the direction of propagation of bulk acoustic waves;
    a first input transducer means coupled to said upper surface of said ferrimagnetic substrate material for generating bulk acoustic waves toward said lower surface of said ferrimagntic substrate material, wherein said variable magnetic field varies the frequency of said bulk acoustic wave;
    a first connecting means for coupling an input signal to said first transducer; and
    a second connecting means for coupling said first transducer to provide an output signal.

* * * * *